United States Patent [19]

Allen et al.

[11] 4,328,525

[45] May 4, 1982

[54] PULSED SINE WAVE OSCILLATING CIRCUIT ARRANGEMENT

[75] Inventors: Jay W. Allen, Los Gatos; Peter J. Granata, San Martin, both of Calif.

[73] Assignee: International Business Machines Corporation, Armonk, N.Y.

[21] Appl. No.: 163,594

[22] Filed: Jun. 27, 1980

[51] Int. Cl.³ .......................................... H01H 47/22
[52] U.S. Cl. ............................... 361/152; 331/117 R; 361/156
[58] Field of Search ............... 361/154, 156, 139, 152, 361/160, 203; 331/117 R

[56] References Cited

U.S. PATENT DOCUMENTS

| | | | |
|---|---|---|---|
| 3,344,336 | 9/1967 | Moyer et al. | 321/18 |
| 3,548,296 | 12/1970 | Sundström | 323/102 |
| 3,636,475 | 1/1972 | Steckler | 331/117 R |
| 3,720,883 | 3/1973 | Hess, Jr. et al. | 331/55 |
| 3,792,360 | 2/1974 | Carlow | 328/14 |
| 3,946,373 | 3/1976 | Moolenbeek et al. | 340/174 TF |
| 3,952,292 | 4/1976 | Komatsu et al. | 340/174 TF |
| 3,972,036 | 7/1976 | Navratil | 340/174 TF |
| 3,972,037 | 7/1976 | Hess et al. | 340/174 TF |
| 3,976,932 | 8/1976 | Collins | 321/45 R |
| 4,106,088 | 8/1978 | Bergan | 363/132 |
| 4,153,880 | 5/1979 | Navratil | 328/27 |

OTHER PUBLICATIONS

K. Yamagishi, H. Maegawa, M. Komatoh & S. Takai; "A New Proposal on Field Access Bubble Drives", IEEE, Magnetics, vol. 11, Jan. 1975, pp. 16–20.
G. P. Vella-Coleiro & W. E. Hess; "Generation of Rotating Magnetic Fields for Bubble Devices", IEEE, Magnetics; vol. 10, 9–1974, pp. 750–752.
T. Toyooka, S. Yoshizawa & N. Saito, "Coil Drive Circuits for a High Speed & Large Capacity Magnetic Bubble Memory", Report Central Research Lab. Hitachi Ltd. 1976, pp. 1–2.
G. P. Hixon, R. K. Joseph & L. C. Liebschutz; "Research on Two–Megacharacter Thruput Boram", Technical Report, IBM-FSD, Oct. 1962.

*Primary Examiner*—Harry E. Moose, Jr.
*Attorney, Agent, or Firm*—George E. Roush

[57] ABSTRACT

A sine wave oscillating circuit arrangement useful in generating an electromagnetic field, for example, comprises a resonant circuit including an inductor through which the current is tightly controlled and a capacitor connected in parallel, to which dc pulses are applied at a repetition rate equal to the resonant frequency. The current flowing in the inductor is sensed in phase detector and amplitude detectors. The results of these evaluations are applied to cascaded pulse position and pulse width and/or amplitude modulators. A current switching driver circuit driven by pulses from the modulator is connected to the resonant circuits for modifying the dc pulses applied for maintaining the sine wave current in the inductor at the proper amplitude and phase relationship and energy content inversely as the potential across the sampling resistor in the resonant circuit. The energy dissipated in damping the resonant circuit in one cycle of operation is replaced in the next cycle.

12 Claims, 4 Drawing Figures

PULSED SINE WAVE OSCILLATING CIRCUIT ARRANGEMENT

FIELD

The invention relates to sine wave oscillating circuitry, and it particularly pertains to such circuitry for producing an electromagnetic field of precise characteristics.

BACKGROUND

There are a number of applications for uniform magnetic fields that require precise characteristics, usually at relatively high frequencies. Many of these applications use circuitry developed for producing accurately regulated alternating current waves from a source of direct current. More recently, electromagnetic recording systems have received attention to the generation of more precise magnetic fields than heretofore. The most important application currently is for magnetic bubble data storage apparatus. In this application a pair of magnetic field generating devices are arranged to create a rotating magnetic field of precise characteristics in the place of a magnetic bubble storage chip. A sine wave current is made to traverse each inductor for generating a component of the rotating field, and that current is controlled in amplitude and phase to the degree required for the application at hand. The requirement is frequently strict, and while many circuit arrangements have been put together for operating magnetic bubble storage devices, there remain too many shortcomings in the art.

SUMMARY

The objects indirectly referred to hereinbefore, and those that will appear as the specification progresses, obtain in a sine wave oscillating circuit arrangement having a resonant circuit comprising an inductor through which the current is tightly controlled and a capacitor connected in parallel, to which combination pulses of direct current are applied at a repetition rate substantially equal to the resonant frequency of the circuit. An electromagnetic field of sine waveform is generated in the inductor due to filtering action of the resonant circuit.

The current flowing in the inductor is sensed, as by measuring the potential across a resistor of low value interposed in series with the inductor, and the resultant is applied to servocircuitry for modifying the application of the direct current pulses to the resonant circuit for maintaining the sine wave current in the inductor at the proper amplitude and phase relationship. Preferably, the circuitry for applying the pulsations of current to the resonant circuit is a current switching driver circuit, and this circuit is driven by pulses from a train of substantially uniform pulses that are modified in time and/or phase and in energy content inversely as the potential across the sampling resistor in the resonant circuit. In this manner, the electric energy dissipated in the effective damping resistance component of the resonant circuit in one cycle of operation is replaced in the next cycle.

The sampled potential across the sampling resistor is of sine waveform. It is applied to a phase detector circuit of conventional form and to an amplitude detector of conventional form. The results of these evaluations are applied first to a pulse position modulator circuit and to a pulse width and/or pulse amplitude modulator circuit. The latter circuits are connected in series between the current switching driver circuit and an initial pulse generating circuit, all three circuits being operated in synchronism with a train of master timing clock pulses.

It is essential that a train of pulses of repetition rate substantially equal to the frequency of the sine wave be applied to the current switching driver circuit. It is also essential in some instances that the initial pulse be much greater in width than the succeeding pulses. Preferably, according to the invention, the train of master clock pulses has a repetitive rate of a multiple of that of the pulses applied to the driver circuit for running the system, and counting circuit arrangements are used in the generating and modulating circuits for generating an initial pulse by counting a number of timing clock pulses, for shifting the counting one or two master timing pulses one way or the other for adjusting the phase, and for shifting the final count by one or two master timing pulses for adjusting the width and/or amplitude of the running pulses. Conventional counting, gating and logical circuitry is readily adapted to this use.

PRIOR ART

Prior art circuitry having some structure in common with the structure according to the invention will be found in these U.S. patents:

| | | | |
|---|---|---|---|
| 3,344,336 | 9/1967 | Moyer et al | 321/18 |
| 3,548,296 | 12/1970 | Sundström | 323/102 |
| 3,792,360 | 2/1974 | Carlow | 328/14 |
| 3,946,373 | 3/1976 | Moolenbeek et al | 340/174TF |
| 3,952,292 | 4/1976 | Komatsu et al | 340/174TF |
| 3,972,036 | 7/1976 | Navratil | 340/174TF |
| 3,972,037 | 7/1976 | Hess et al | 340/174TF |
| 3,976,932 | 8/1976 | Collins | 321/45R |
| 4,106,088 | 8/1978 | Bergan | 363/132 |
| 4,153,880 | 5/1979 | Navratil | 328/27 |

And in the literature:

K. Yamagishi, H. Maegawa, M. Komatsh and S. Takai; "A New Proposal on Field-Access Bubble Drives"; Transactions IEEE; Magnetics; Vol 11, January 1975;pp 16–20.

G. P. Vella-Coleiro and W. E. Hess; "Generation of Rotating Magnetic Fields for Bubble Devices"; Transactions IEEE; Magnetics; Vol 10, September 1974; pp 750–752.

T. Toyooka, S. Yoshizawa and N. Saito; "Coil Drive Circuits for a High Speed and Large Capacity Magnetic Bubble Memory"; Report, Central Research Laboratory, Hitachi Ltd.; 1976; pp 1–2.

G. P. Hixon, R. K. Joseph and L. C. Liebschutz; "Research on Two-Megacharacter Thruput Boram"; Technical Report, IBM FSD; October 1962.

The patents to Moyer and Brandon and to Collins are directed to circuit arrangements for developing current waves in inductive loads, but involve saturable magnetic core and passing semiconductor device circuitry operating in a switching mode.

The Sundström patent discloses a feedback circuit arrangement for correcting the phase and amplitude of a signal in circuitry using a pair of phase detector circuits and a source of reference signal of the order of the corrected signal for frequency detection.

The patent to Moolenbeek is directed to a circuit for controlling the current in rotating magnetic field apparatus with a switching arrangement responding to sine wave signals. Komatsu and others teach control by square wave signals.

Phase correction is taught in the patents to Carlow and to Hess et al wherein central circuitry and feedback handling circuitry are arranged for adjusting phase to a desired predetermined output.

The two patents of Navaratil are directed to circuitry for developing a rotating magnetic field. The earlier patent is directed to an "H switching" arrangement generating triangular current waves for application to inductors, while the later patent is directed to switching square waves for the same end result. Bergan discloses circuitry for passively and selectively switching a resistor-capacitor time delay circuit for achieving the desired wave shape.

The publications set forth the state-of-the-art prior to the Applicants' invention, but do not anticipate the structure of the invention as will be seen hereinafter.

While this art is directed to magnetic bubble data storage apparatus or components that those skilled-in-the-art could readily apply to such apparatus, it readily will be seen from the description hereinafter that the structure of the invention for controlling the flow of energy into an inductor in response to the determination of phase and of amplitude variations in the current flowing therein is not found in this art.

DRAWING

In order that all the advantages of the invention obtain in practice, the best mode embodiment thereof, given by way of example only, is described in detail hereinafter, with reference to the accompanying drawing, forming a part of the specification, and in which.

Figure 1:
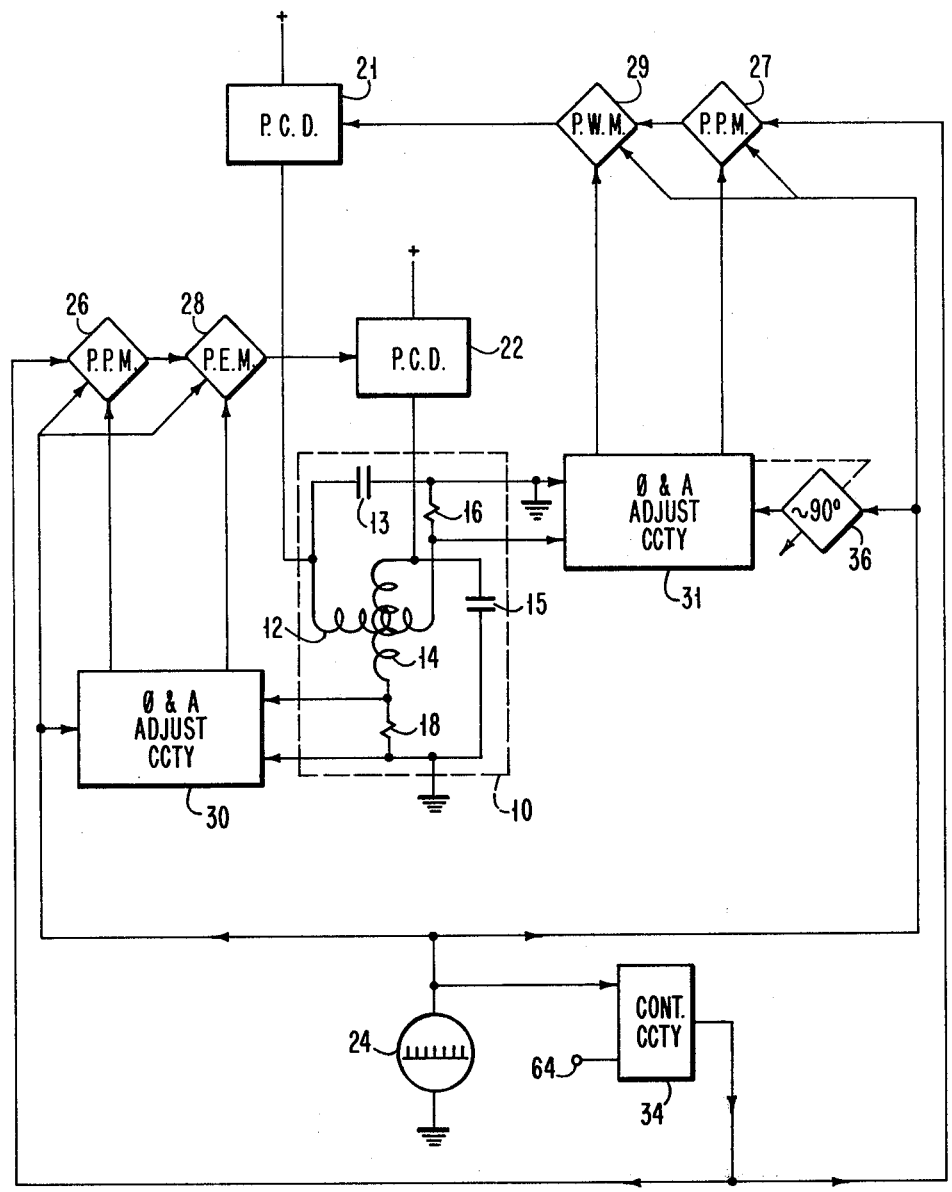
FIG. 1 is a functional diagram of a system according to the invention as applied to magnetic bubble data storage apparatus.

The rudiments of a system according to the invention for establishing and controlling a rotating electromagnetic field in the plane of a magnetic bubble data storage chip is shown in FIG. 1. The data storage chip and a pair of permanent magnets arranged for subjecting the chip to a light rotating magnetic field preventing total bubble collapse and loss of data in the event of failure of the controllable magnetic field, are not shown in the interest of clarity of the apparatus according to the invention; the former, however, are located centrally of the dashed rectangle 10 and actually centrally of the windings of the electromagnetic apparatus shown here schematically as two coils 12, 14 arranged normally with respect to each other. Capacitors 13, 15 form parallel resonant circuits with the windings 12, 14 respectively at the operating frequency of the order of 200–400 KiloHertz, for example. A resistor 16 (18) is interposed in series with the inductor 12 (14) for sampling the current, and therefore has as low a value (6–8 ohms) as is practicable. The rotating magnetic field is generated by the application of pulses of direct current from controllable pulsed current driver circuits 21, 22. The individual magnetic fields resulting from this excitation interact due to the quadrature physical relationship and sine wave amplitude to produce a substantially uniform rotating magnetic field in the plane of the chip.

The overall apparatus comprises two substantially identical circuit arrangements, and one will be described with reference numerals of the other in parenthesis where applicable. A master clock pulse train of high pulse repetition rate, of the order of 24–60 MegaHertz, is used for synchronizing the overall operation of a pulse position or like modulating circuit 26 (27), a pulse energy modulating circuit 28 (29), and a phase and amplitude adjusting circuit arrangement 30 (31). The pulse energy modulating circuit in some instances is a pulse width modulator circuit, it alternately is a pulse amplitude modulator circuit. Practically, it is an advantage that a modulator circuit in which both width and amplitude vary is less expensive and easily controlled, and the pulse driver circuit is switched in response to the energy from the modulator circuitry. The generator 24 is connected to control circuitry 34 for controlling a train of pulses, at 200–500 KHz repetition rate, for application to the pulse position modulating circuit 26 (27). Preferably, a variable phasing circuit 36 is interposed between the generator 24 and the phase and amplitude adjusting circuitry 31 whereby the phase relationship between the two adjustment circuits can be trimmed to 90° exactly, or that angle close to 90° at which a perfectly circular rotating magnetic field obtains. Automatic control of the phasing circuit 36 is contemplated.

Figure 2:
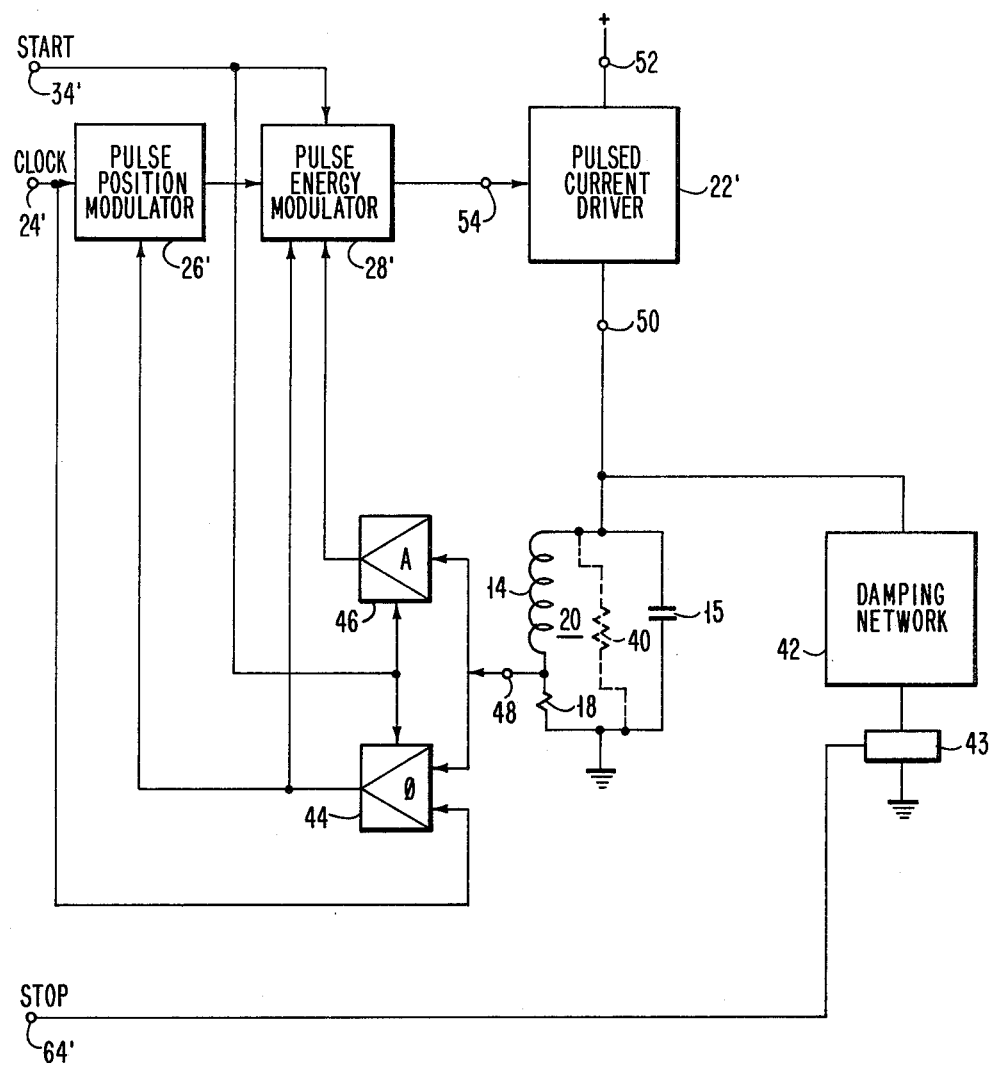
FIG. 2 is a best mode embodiment of another functional diagram of a system according to the invention in greater detail.

FIG. 2 is a functional diagram of a best mode embodiment of one of the circuit arrangements in more detail. The magnetic field is created by a pulse of direct current applied to the parallel resonant circuit 20; a resulting sine wave current flows in the inductor 14 and in the sampling resistor 18. The current is applied by a gated pulsed current driver circuit 22 which is rendered effective for replacing the energy dissipated in the effective damping resistance element 40 in the last prior cycle of operation. The damping resistance element 40 as shown, is an equivalent element comprising the parallel resistance component of the capacitor 15, the series resistance component of the inductor 14, and the small resistance of the sampling resistor 18 converted to a single parallel resistance element in accordance with the well known Norton's Theorem. In more advanced embodiments of the invention, additional damping resistance of a network 42 is actually inserted by a suitable switching arrangement 43 and the like. Thus, there is much in the way of variable factors involved in the control of the magnetic field developed.

Because of the resonant circuit 20 acting as a filter, the current flowing through the inductor 14 and the resistor 18 is of sine waveform. Essentially the phase relationship of the sine wave (as synchronized with the master clock pulse train applied at an input terminal 24'), is determined in a phase detector circuit 44, and then is used to determine the timing of a subsequent pulse emerging from a pulse position modulating circuit 26' and applied to a pulse strength or pulse energy modulating circuit 28'. The amplitude of the sine waveform is determined in an amplitude detector circuit 46 and then used to determine the width and/or amplitude of that subsequent pulse as it emerges from the pulse energy modulating circuit 28'. The resultant pulse then is applied to the pulsed current driver circuit 22' for applying the exact amount of energy to the resonant circuit 20 necessary to replace that dissipated in the effective damping resistance element 40.

There are many ways for thus monitoring the sinewave output of the oscillating circuit, and for gating energy to the circuit for maintaining constant output energy and waveform. One way of the many, for example, is begun by determining the phase relationship of the sinewave with respect to the reference clock signal, or better with respect to a subharmonic of the clock signal. This is readily done by determining the zero-crossing of the sine-wave by merely comparing the instantaneous amplitude with reference potential and counting the number of clock, or subharmonic clock, pulses for determining phase-lead, in-phase, or phase-lag relationship as an algebraic digital value. The amplitude relationship of the sinewave is had by measuring the amplitude with respect to reference potential, and converting from the analog value to a binary digital value. The phase value is converted to a binary digital value in the pulse position modulating circuit 26' by counting up or down from a predetermined reference value as the lead or lag determines. Opening a gate in the pulsed current driving circuit is effected after counting down the phase binary digital value. The two digital values are now combined by adding in the pulse energy modulating circuit and the resultant digital number is used for closing the gate in the pulsed current driving circuit. Thus the time in which the gate is open for adding energy to the oscillating circuit 20 is deducted by effectively subtracting the values at the output of the pulse position modulator and the sum of the phase and the amplitude values combined in the pulse energy modulating circuit. Other ways for monitoring and controlling the sinewave will be suggested to those skilled in the art; for example, a similar way is one involving holding the pulse width constant and controlling the amplitude of the pulse signal for adjusting the drive current.

The circuit arrangements for the detectors, the modulators and the driver are conventional or assembled by those skilled-in-the-art following conventional practice. It is an advantage of the system according to the invention that a less precise modulator of conventional design is sufficient as will be discussed. Such an arrangement preferably will use the driver circuit shown in FIG. 3.

Figure 3:
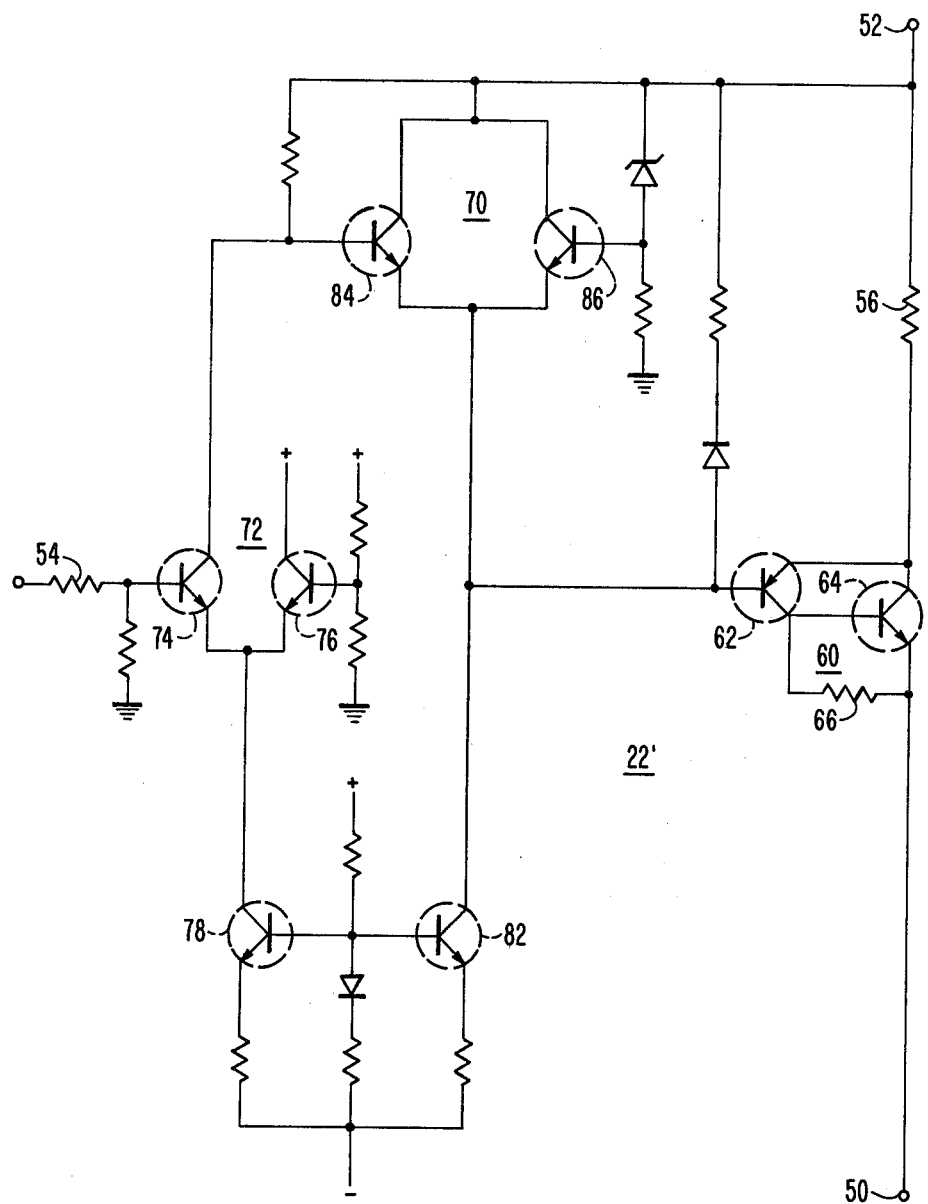
FIG. 3 is a schematic diagram of a pulsed current driver circuit according to the invention.

The pulsed current driver 22' is arranged for supplying current at a constant rate to a terminal 50 from a source at a terminal 52 in response to a signal from the pulse energy modulator 28' control input terminal 54. The controlled current flows through a resistor and a transistor valve circuit 60 comprising a pnp transistor 62, an npn transistor 64 and a resistor 66 connected as shown in FIG. 3. A control signal is connected to the base electrode of the pnp transistor 62, after processing in preamplifier circuits 70 and 72. The latter comprises a differential amplifier circuit having a pair of transistors 74, 76 operated on a constant current source having a transistor 78. The other amplifier circuit 70 has a pair of transistors 84, 86 connected to a constant current source transistor 82. This driver circuit arrangement lends itself to tight control of the output current at a minimum of circuit design.

Figure 4:
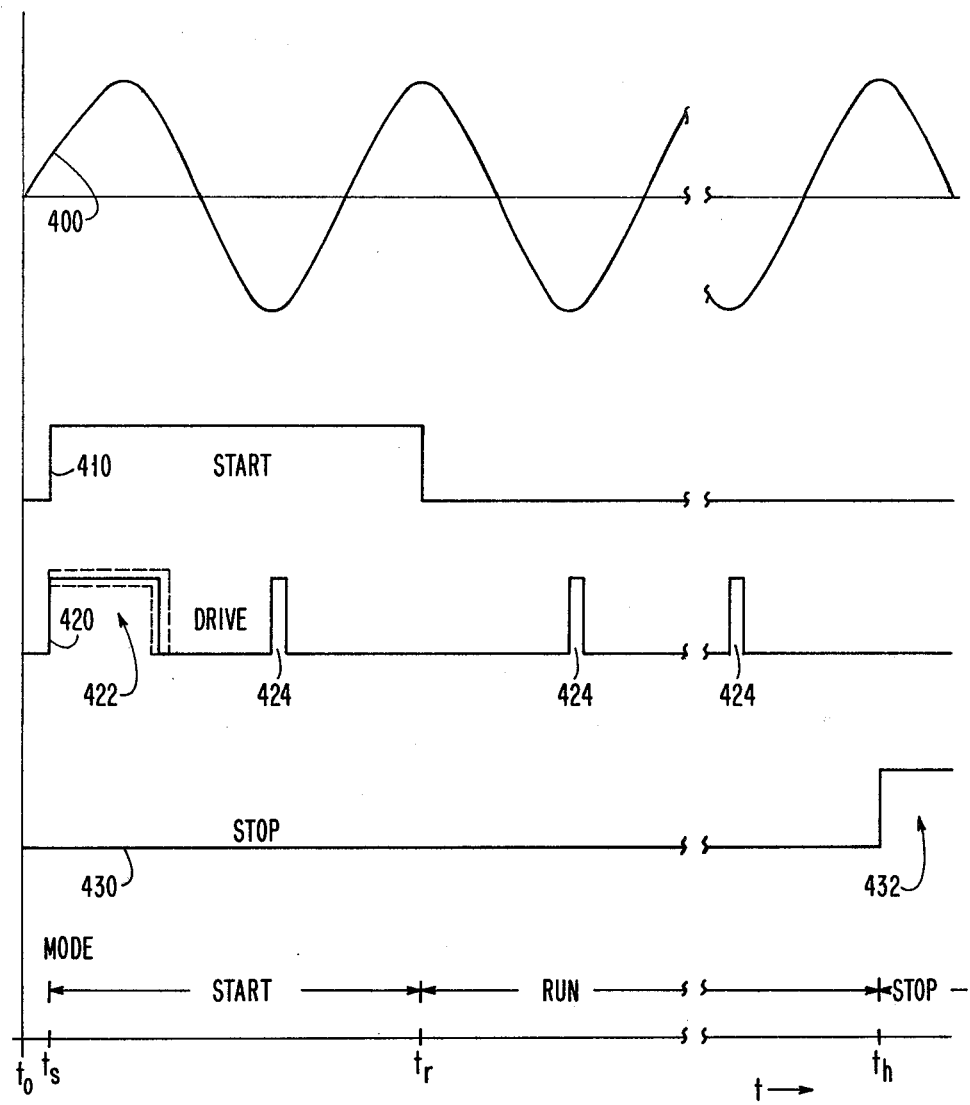
FIG. 4 is a graphical representation of waveforms useful in an understanding of the operation of the illustrated system according to the invention.

A graphical representation of waveforms useful in an understanding of the operation of circuitry according to the invention is found in FIG. 4. The sine wave of current desired through the inductor 14 is represented by curve 400, and a curve 410 represents a wave having a start pulse 412. A driving pulse wave is represented by the curve 420 in which an initial pulse 422 is followed by a train of drive pulses 424 of repetition frequency equal to the resonant frequency of the circuit 20 which is the frequency of the sine wave 400. A curve 430 depicts a wave having a stop pulse 432.

There are three modes of operation that are of interest here:
(a) start mode;
(b) run mode; and
(c) stop mode.

During the start mode, the current in the inductor 14 is increased from zero to a peak value required for the intended purpose, for example to operate a bubble data storage module. Because the current that must be introduced into the inductor 14 to reach the peak value when starting from zero, is typically much greater than that required to sustain the peak oscillating current in the run mode, the strength or the energy carried in the first pulse 422 (FIG. 4) must be greater (by a factor of 8 in many instances) than that in each of those run pulses 424 that follow. This is achieved by making the amplitude and/or width of the first pulse substantially greater than those run pulses 424 that follow.

The leading edges of the run pulses 424 are established in the operation of the phase detector circuit 44 and the pulse position modulator circuit 26', and thereafter the energy applied to the inductor 14 is established by the operation of the amplitude detector circuit 46 and the pulse strength modulator circuit 28'.

Since the strength or energy of the drive pulse magnifies the result of a change in pulse position, the output of the phase detector is convenient in determining pulse strength. The pulse strength modulator circuit is implemented in one of two ways or possibly a combination of the two.

(a) The width of the pulse sent to the current driver is held constant and amplitude of the current varied in the driver according to the output of the amplitude detector circuit.

(b) The amplitude of the drive current pulse is held constant and the width of the pulse varied as a function of the amplitude detector circuit. In both cases the leading edge of the drive pulse is set by the pulse position modulator 26'.

The operation of the overall circuitry is initiated in response to a received start pulse or level applied at an input terminal 34'. It is arranged with conventional timing and logical gating circuits for initiating an initial drive pulse, and setting the amplitude and phase detectors 44, 46 in high gain initial modes. The high gain initial modes are used only when measuring the amplitude and phase errors created by the start pulse 422. These errors then are applied to determine the position and strength of the succeeding drive pulses 424. The reason for the high gain mode is that when starting the oscillator in the resonant circuit 20, there is no feedback information, phase or amplitude available. Thus, the system is open-loop and the initial drive pulse is a fixed width and amplitude. The first cycle of current in the resonant L-C circuit 20 resulting from the initial drive pulse is a measure of the error in the system. This error is multiplied in the high gain mode to bring the system into equilibrium, correcting the amplitude and phase of that current as quickly as possible.

The run mode follows the application of the second current pulse driven into the inductor 14. The amplitude and phase of the current in the inductor 14 are monitored and the position and strength of the drive current pulses are fine tuned. These current pulses make up for energy losses and L-C frequency tolerances in the resonant circuit 20.

The stop mode is arranged simply to bring the current in the inductor 14 down from its peak run value to zero in an orderly fashion. Stopping the current flow in the inductor 14 consists of turning off the drive pulses 424 and switching in a damping network 42. The latter is actuated in response to a received stop pulse 432 or level at the input terminal 46′.

While the invention has been described in terms of an express embodiment, and alternatives have been suggested, it should be recognized that those skilled in the art will suggest other changes without departing from the spirit and scope of the invention as defined in the appended claims.

The invention claimed is:

1. A pulsed sine wave oscillating circuit arrangement comprising
   a resonant circuit including an inductor through which current flow is to be accurately controlled and a capacitor substantially connected in paralled with said inductor, and having a sampling resistor in series circuit with said inductor,
   said resonant circuit having an effective damping resistance element in parallel therewith,
   a source of electric pulses of substantially constant pulse repetition rate,
   pulsing circuitry coupled to said pulse source and to said circuit for applying pulsated current to said resonant circuit, and
   (characterized by)
   servo circuitry having an input circuit connected across said sampling resistor and an output circuit connected to said pulsing circuitry for delivering to said resonant circuit, a pulse of electric energy in each cycle of operation substantially replacing that dissipated in said effective damping resistance element during the previous cycle.

2. A pulsed sine wave oscillating circuit arrangement, comprising
   a resonant circuit including an inductor through which current flow is to be accurately controlled and a capacitor substantially connected in parallel with said inductor, and having a sampling resistor in series circuit with said inductor,
   said resonant circuit having an effective damping resistance element in parallel therewith,
   a source of electric pulses of substantially constant pulse repetition rate,
   pulsing circuitry coupled to said pulse source and to said circuit for applying pulsated current to said resonant circuit, and
   (characterized by)
   servo circuitry having an input circuit connected across said sampling resistor, having intermediate circuitry for determining phase and amplitude variations in the current flowing in said sampling resistor, and having an output circuit connected to said pulsing circuitry for delivering to said resonant circuit, a pulse of electric energy determined in accordance with said phase and current variations for substantially replacing that dissipated in said effective damping resistance element during the previous cycle.

3. A pulsed sine wave oscillating circuit arrangement as defined in claim 1, and wherein
   said servo circuitry comprises
   a source of direct current,
   a pulse generating circuit connected in series with said direct current source between the terminals of said resonant circuit and having a control terminal,
   one feedback loop having an input circuit connected across said sampling resistor and having an output circuit coupled to said control terminal of said pulse generating circuit, and
   another feedback loop having an input circuit connected across said sampling resistor and having an output circuit coupled to said control terminal of said pulse generating circuit,
   whereby for each cycle of operation said pulse generating circuit delivers a pulse of energy to said resonant circuit replacing the energy dissipated in said effective damping resistance element during the previous cycle.

4. A pulsed sine wave oscillating circuit arrangement as defined in claim 2, and wherein
   said pulse generating circuit comprises
   a current controlling transistor having a collector electrode connected to said source of direct current having an emitter electrode connected to said resonant circuit and having a base electrode, and
   transistor circuitry connected between said base electrode and said control terminal of said pulse generating circuit.

5. A pulsed sine wave oscillating circuit arrangement as defined in claim 3, and wherein
   said one feedback loop comprises
   an amplitude detecting circuit having an input connected across said sampling resistor, and having an output delivering a level directly proportional to the amplitude of potential across said sampling resistor, and
   a pulse energy modulating circuit having one input coupled to said source of substantially constant pulse repetition rate pulses, another input connected to said amplitude detecting circuit for modifying the energy delivered by said modulating circuit inversely proportional to the amplitude of said potential across said sampling resistor and having an output connected to said control terminal of said pulse generating circuit.

6. A pulsed sine wave oscillating circuit arrangement as defined in claim 2, and wherein
   said other feedback loop comprises
   a pulse position modulating circuit having one input connected to said source of substantially constant pulse repetition rate pulses, having a phase error input, having an output connected to said control terminal of said pulse generating circuit,
   a phase detecting circuit having an input connected across said sampling resistor and having an output connected to said pulse position modulating circuit for modifying the time at which said pulse generating circuit delivers said pulse of energy to said resonant circuit.

7. A pulsed sine wave oscillating circuit arrangement as defined in claim 2, and wherein
   said pulse generating circuit comprises
   a pair of current controlling transistors of opposite conductivity having a collector of one and an emitter electrode of the other connected to said source of direct current, having an emitter electrode of one and the collector of the other connected to said resonant circuit, having the base electrode of said one transistor connected to the collector electrode of the other and having a base electrode of the one transistor, and transistor circuitry connected between said base electrode and said control terminal of said pulse generating circuit.

8. A pulsed sine wave oscillating circuit arrangement as defined in claim 7, and incorporating a pair of cascaded differential amplifying circuits interposed between said control terminal and said base electrode of said one transistor.

9. A pulsed sine wave oscillating circuit arrangement as defined in claim 2, and wherein a differential amplifying circuit and an emitter-follower circuit, are cascaded between said control terminal and said base electrode of said one transistor.

10. A pulsed sine wave oscillating circuit arrangement, comprising a pair of resonant circuits, each resonant circuit including an inductor through which current flow is to be accurately controlled and a capacitor substantially connected in parallel with said inductor, and having a sampling resistor in series circuit with said inductor, each said resonant circuit having an effective damping resistance element in parallel therewith, a source of electric pulses of substantially constant pulse repetition rate, pulsing circuitry coupled to said pulse source and to said circuits for applying pulsated current to each of said resonant circuits, and servo circuitry having input circuitry connected across said sampling resistors and output circuitry connected to said pulsing circuitry for delivering to each of said resonant circuits, pulses of electric energy in each cycle of operation substantially replacing that dissipated in said effective damping resistance elements during the previous cycle, the inductors of said resonant circuits being arranged about a common plane surface and with the axes of the inductors normal to each other whereby said common plane surface is subjected to a rotating magnetic field, and said servo circuitry having subcircuitry for insuring the currents in said inductors are related for establishing a substantially circular rotating magnetic field.

11. A pulsed sine wave oscillating circuit arrangement as in claim 10, and wherein said servocircuitry includes a phase shifting circuit arranged to present pulses from said source of pulses to said resonant circuits substantially 90° apart.

12. A pulsed sine wave oscillating circuit arrangement as in claim 11, and wherein said phase shifting circuit is adjustable.

* * * * *